United States Patent [19]
Shinohara

[11] Patent Number: 5,990,508
[45] Date of Patent: Nov. 23, 1999

[54] FERROELECTRIC MEMORY

[75] Inventor: Sota Shinohara, Tokyo, Japan

[73] Assignee: NEC Corporation, Tokyo, Japan

[21] Appl. No.: 09/095,055

[22] Filed: Jun. 10, 1998

[30] Foreign Application Priority Data

Jun. 10, 1997 [JP] Japan .................................. 9-152439

[51] Int. Cl.⁶ .................................................. H01L 29/72
[52] U.S. Cl. .......................... 257/295; 257/296; 257/304; 257/306; 257/300; 257/308; 257/309; 257/310
[58] Field of Search ..................................... 257/295, 296, 257/304, 306, 300, 308, 309, 310

[56] References Cited

U.S. PATENT DOCUMENTS 5,633,781  5/1997  Saenger et al. .......................... 257/296
5,751,540  5/1998  Lee et al. ................................. 257/295

FOREIGN PATENT DOCUMENTS 7-50394   2/1995  Japan .
7-235639  9/1995  Japan .

OTHER PUBLICATIONS

N. Tanabe et al., "A Ferroelectric Capacitor over Bit–line (F–COB) Cell for High Density Nonvolatile Ferroelectric Memories", 1995 *Symposium on VLSI Technology Digest of Technical Papers*, 1995, pp. 123–124.

*Primary Examiner*—E. Wojciechowicz
*Attorney, Agent, or Firm*—Sughrue. Mion, Zinn, Macpeak & Seas, PLLC

[57] ABSTRACT

A contact hole is formed in a protective film 9 so as to communicate with an upper electrode 15. In the contact hole is formed a conductor 13 made of substantially the same material as used for the upper electrode 15, so as to communicate with the upper electrode 15 and extend to the outside of the contact hole. The conductor 13 is electrically connected to a memory cell transistor, by a wiring layer 14.

14 Claims, 4 Drawing Sheets

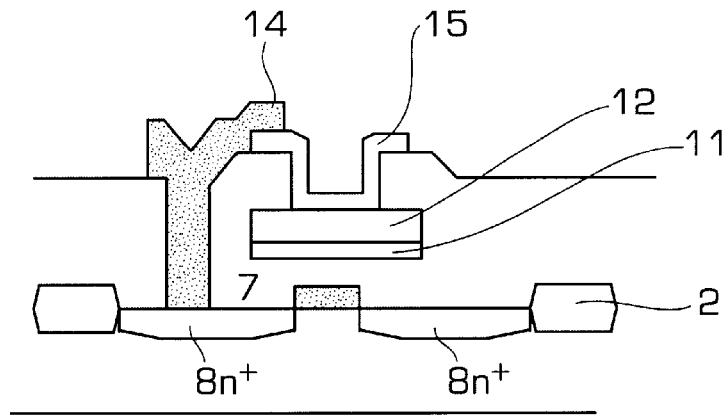
FIG.3
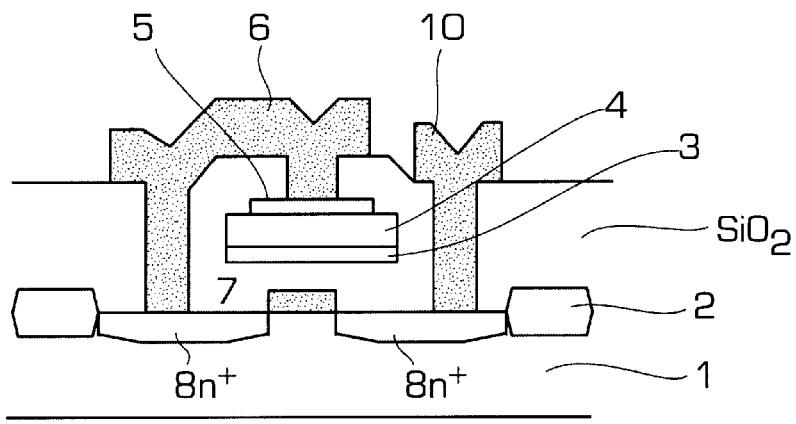
FIG. 4
PRIOR ART
FIG. 5
PRIOR ART
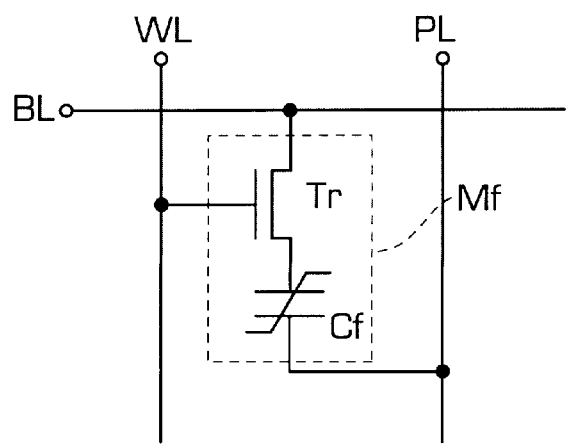

FERROELECTRIC MEMORY

BACKGROUND OF THE INVENTION

1. Field of the Invention

The present invention relates to a ferroelectric memory, an more particularly to a ferroelectric memory having a memory cell transistor and a ferroelectric capacitor both formed on a semiconductor substrate for memory retention.

2. Description of the Related Art

In recent years, active technical developments have been made on a ferroelectric memory having a ferroelectric film of spontaneous polarization property as the capacitive insulating film. This ferroelectric memory has a feature of being capable of storing information by the polarization of the ferroelectric capacitor formed on a semiconductor substrate. FIG. 4 shows a sectional view of an example of the unit cell memory constituting a conventional ferroelectric memory. As shown in FIG. 4, $n^+$ diffusion layers 8 as source/drain regions are formed in the surface regions of a p type silicon substrate 1, and also a gate electrode 7 is formed on the p type silicon substrate via a gate insulating film; thereby, a field effect transistor (which is a cell transistor) is constituted. A bit line 10 made of Al is connected to one of the diffusion layers 8 as source/drain regions, of the field effect transistor.

On the field effect transistor is formed, via an interconnection insulating film, a ferroelectric capacitor constituted by a lower electrode 3, a ferroelectric film 4 and an upper electrode 5. The upper electrode 5 is connected to the other diffusion layer 8 as source/drain region, of the field effect transistor via a wiring layer 6. The ferroelectric film 4 is made of PZT ($PbZr_xTi_{1-x}O_3$), SBT ($SrBi_2Ta_2O_9$) or the like. The lower electrode and the upper electrode are made of an oxidation-resistant noble metal (e.g. Pt) or a conductive oxide (e.g. $RuO_2$) because annealing in an oxidizing atmosphere is often necessary for the formed ferroelectric capacitor in order to stabilize the thin ferroelectric film of the capacitor. As the wiring layer 6, there is used, for example, a multilayered film consisting of a Ti layer, a TiN layer and an Al layer because the wiring layer 6 are required to be superior in fine processability, adhesivity to Si or $SiO_2$ and resistivity (i.e. low resistivity).

An equivalent circuit of this memory cell is shown in FIG. 5. A memory cell MC is constituted by the in-series connection of a field effect transistor Tr and a ferroelectric capacitor Cf. The gate electrode of the field effect transistor Tr is connected to a word line WL; one of the source/drain regions is connected to a bit line BL; and the other source/drain region is connected to one of the electrodes of the ferroelectric capacitor Cf. The other electrode of the ferroelectric capacitor Cf is connected to a plate line PL. Generally, the word line WL functions also as the gate electrode of the field effect transistor Tr, and the plate line PL functions also as the lower electrode of the ferroelectric capacitor.

The memory cell MC shown in FIG. 5 is arranged in a matrix form and constitutes a large-scale non-volatile memory.

Next, the process for producing a conventional memory cell shown in FIG. 4 is explained with reference to FIG. 6. FIGS. 6(a) to 6(c) are sectional views showing the steps of the process for producing a conventional memory cell. A ferroelectric capacitor comprising a lower electrode 3, a ferroelectric film 4 and an upper electrode 5 is formed on an interconnection insulating film formed on a silicon substrate 1 having a semiconductor integrated circuit (e.g. memory cell transistors) embedded therein; and a protective film 9 is formed thereon [FIG. 6(a)]. As shown in FIG. 6(b), contact holes are formed which communicate with the upper electrode of the capacitor and also with the diffusion layers of the field effect transistor. Then, as shown in FIG. 6(c), wiring layers are formed to connect one of the diffusion layers of the field effect transistor to the upper electrode of the capacitor and also to form a bit line. Thereafter, a heat treatment is conducted at a temperature higher than 300° C. This heat treatment is an essential step for reduction in contact resistance of transistor, stabilization of threshold volatage, removal of damage applied to ferroelectric capacitor during LSI production process, etc.

In the conventional memory cell, however, there has been a problem that the above heat treatment incurs a substantial reduction in residual polarization intensity of ferroelectric capacitor, which leads to significant deterioration of the memory retention and data-rewriting life of non-volatile memory. The reason for the problem is that the substance (e.g. titanium) constituting the wiring layer diffuses through the upper electrode along the grain boundaries, reaches the ferroelectric film and reacts chemically with the film.

The same problem appears also when a protective film is formed on a memory cell having a structure shown in FIG. 4. That is, at the time when a silicon nitride ($Si_3N_4$) film is formed according to a conventional method (e.g. plasma CVD at a substrate temperature of about 300 to 400° C.), the ferroelectric capacitor is deteriorated and the resulting ferroelectric memory has very low reliability.

SUMMARY OF THE INVENTION

The present invention is intended to suppress the deterioration of a ferroelectric capacitor caused by the heating applied after the formation of a wiring layer and to enhance the reliability of the data-rewriting life and memory retention property of the ferroelectric memory.

The deterioration of the ferroelectric capacitor caused by the heating applied after the formation of wiring layer takes place because the material (e.g. titanium) constituting the wiring layer diffuses through the upper electrode along the grain boundaries, reaches the ferroelectric film and reacts chemically with the film. As a countermeasure to avoid the phenomenon, it is considered to constitute the wiring layer with the same material as used for the upper electrode. However, the material for upper electrode of the ferroelectric capacitor and the material for the wiring layer have different requirements. That is, the material for the upper electrode must not be oxidized and become an insulating material in the heat treatment conducted in an oxidizing atmosphere for the property stabilization of the ferroelectric capacitor after the formation of the upper electrode, or in the heat treatment conducted in an oxidizing atmosphere for removal of the damage applied to the ferroelectric capacitor during LSI production process; for example, the material for upper electrode can be a noble metal (e.g. Pt or Au) or a conductive oxide (e.g. $RuO_2$). Meanwhile, the material for wiring layer must have fine processability, adhesivity to $SiO_2$ film and low resistivity. Hence, it is inappropriate to use the same material for the wiring layer and the upper electrode.

It is also considered to make larger the thickness of the upper electrode and accordingly the distance between the wiring layer and the ferroelectric film in order to reduce the adverse effect of the wiring material (diffusing through the upper electrode) on the ferroelectric film. However, an increase in thickness of the upper electrode makes difficult the production of such an upper electrode and allows the resulting ferroelectric capacitor to have a larger level difference; as a result, there appear problems such as disconnection of the wiring running on the ferroelectric capacitor and it becomes difficult to form a defectless wiring running on the ferroelectric capacitor.

In contrast, when the electrical connection between the upper electrode of the ferroelectric capacitor and the diffusion layer of field effect transistor is made as in FIG. 1 of the present invention, that is, by allowing the wiring layer and the conductor to form a laminated structure at the outside of the contact hole formed in the protective film and communicating with the upper electrode, it is possible to separate the wiring layer and the upper electrode by a distance at least equal to the depth of the contact hole and thereby reduce the adverse effect caused by the diffusion of the wiring material through the upper electrode.

According to the present invention, there is provided a ferroelectric memory comprising a semiconductor substrate, a memory cell transistor formed on the semiconductor substrate, and a ferroelectric capacitor also formed on the semiconductor substrate, the ferroelectric capacitor comprising a lower electrode, an upper electrode and a ferroelectric film interposed between the upper electrode and the lower electrode, in which ferroelectric memory a conductor is formed on the upper electrode so as to contact with the upper electrode and electrical connection is completed between the conductor and the memory cell transistor by a wiring layer.

According to the present invention, there is also provided a ferroelectric memory comprising a semiconductor substrate, a memory cell transistor formed on the semiconductor substrate, a ferroelectric capacitor also formed on the semiconductor substrate, and a protective film formed on the ferroelectric capacitor, the ferroelectric capacitor comprising a lower electrode, an upper electrode and a ferroelectric film interposed between the upper electrode and the lower electrode, the protective film having therein a contact hole communicating with the upper electrode, the ferroelectric capacitor and the memory cell transistor are electrically connected via the contact hole, in which ferroelectric memory a conductor is formed in the contact hole so as to contact with the upper electrode and extend to the outside of the contact hole and electrical connection is completed between the conductor and the memory cell transistor by a wiring layer.

According to the present invention, there is also provided a ferroelectric memory comprising a semiconductor substrate, a memory cell transistor formed on the semiconductor substrate, a ferroelectric capacitor also formed on the semiconductor substrate, and a protective film formed on the ferroelectric capacitor, the ferroelectric capacitor comprising a lower electrode, an upper electrode and a ferroelectric film interposed between the upper electrode and the lower electrode, the protective film having therein a contact hole communicating with the ferroelectric capacitor, the ferroelectric capacitor and the memory cell transistor are electrically connected via the contact hole, in which ferroelectric memory the upper electrode is formed so as to extend into the contact hole and further to the outside of the contact hole and electrical connection is completed between the upper electrode and the memory cell transistor by a wiring layer.

According to the present invention, there is also provided a process for producing a ferroelectric memory, which comprises:

a step of forming a memory cell transistor on a semiconductor substrate and then forming a ferroelectric capacitor comprising a lower electrode, an upper electrode and a ferroelectric film interposed between the upper electrode and the lower electrode, a step of forming a protective film on the ferroelectric capacitor, a step of forming, in the protective film, a contact hole communicating with the upper electrode, a step of forming, in the contact hole, a conductor so as to contact with the upper electrode and extend to the outside of the contact hole, and a step of electrically connecting the conductor and the memory cell transistor with a wiring material.

According to the present invention, there is also provided a process for producing a ferroelectric memory, which comprises:

a step of forming a memory cell transistor on a semiconductor substrate, then forming a lower electrode and a ferroelectric film both of a ferroelectric capacitor in this order, and forming a protective film thereon, a step of forming, in the protective film, a contact hole communicating the ferroelectric film, a step of forming, in the contact hole, an upper electrode so as to contact with the ferroelectric film and extend to the outside of the contact hole, and a step of electrically connecting the upper electrode and the memory cell transistor with a wiring material.

BRIEF DESCRIPTION OF THE DRAWINGS

FIG. 3 is a sectional view showing the structure of a ferroelectric memory of the present invention.

FIG. 4 is a sectional view showing the structure of a conventional ferroelectric memory.

FIG. 5 is a drawing showing an equivalent circuit of a conventional ferroelectric memory.

DETAILED DESCRIPTION OF THE PREFERRED EMBODIMENTS

Figure 1:
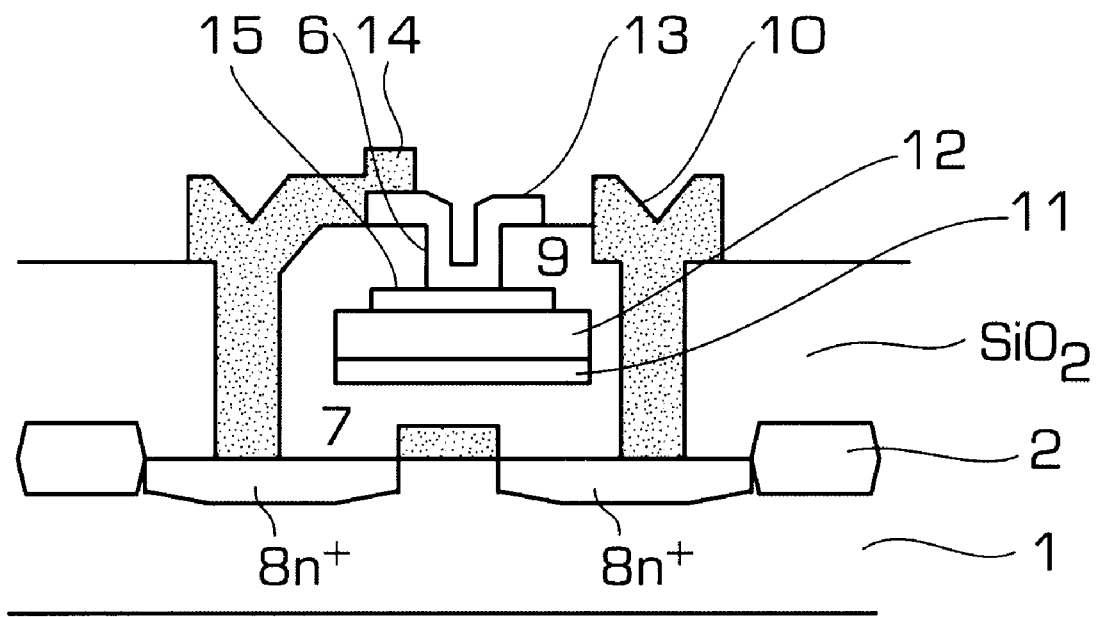
FIG. 1 is a sectional view showing the structure of a ferroelectric memory of the present invention.

An example of the ferroelectric memory of the present invention is shown in FIG. 1. This ferroelectric memory comprises a semiconductor substrate 1, a memory cell transistor formed on the semiconductor substrate, a ferroelectric capacitor also formed on the semiconductor substrate, and a protective film 9 formed on the ferroelectric capacitor. The ferroelectric capacitor comprises a lower electrode 11, an upper electrode 15 and a ferroelectric film 12 interposed between the two electrodes. In the protective film 9 is formed a contact hole communicating with the upper electrode 15, and the ferroelectric capacitor and the memory cell transistor are electrically connected via the contact hole. In the contact hole is formed a conductor 13 made of substantially the same material as used for the upper electrode 15, so as to contact with the upper electrode 15 and extend to the outside of the contact hole, and the conductor 13 and the memory cell transistor are electrically connected by a wiring layer 14.

In the ferroelectric memory of the present invention, as the material for the upper electrode and the lower electrode, there can be mentioned Pt, Ir, Ru, RuO$_2$, Au, etc. The upper electrode and the lower electrode are made mainly of such a material. Of the above materials, Pt is preferably used for the reasons of good adhesivity to the ferroelectric film, etc.

In the ferroelectric memory of the present invention, the conductor is preferably formed as shown in FIG. 1, that is, in the contact hole so as to contact with the upper electrode and extend to the outside of the contact hole. By this arrangement, the wiring layer 14 and the upper electrode 15 can be made apart from each other by a distance at least equal to the depth of the contact hole. Since the depth of the contact hole, i.e. the thickness of the protective film is usually 200 to 500 nm, such a distance between the wiring layer and the upper electrode can reliably prevent the diffusion of the wiring layer material into the ferroelectric film.

The thickness of the conductor is needed to be determined so that no disconnection takes place at the side wall of the contact hole. The conductor is formed by sputtering or the like, and its thickness is smaller at the contact hole side wall portion, i.e. the portion perpendicular to the wafer surface that at the portion parallel to the wafer surface. The difference in thickness between the two portions varies depending upon the size, depth, etc. of contact hole and cannot be specified in a particular range. As a representative example, when the contact hole has a diameter of about 1000 nm and a depth of about 400 nm, the thickness of the conductor is 50 to 500 nm, preferably 100 to 300 nm. A thickness of 50 nm or more causes no disconnection. A larger thickness requires a longer time for conductor production, and the effect of disconnection prevention remains the same even when a larger-than-required thickness is used; therefore, the upper limit of thickness is preferably 500 nm.

The conductor is made of a material capable of suppressing the diffusion of the material (e.g. Ti) constituting the wiring layer. The conductor can be made of, for example, Pt, Ir, Ru, Ru$_2$O or Au (these are materials used for the upper electrode), or TiN.

In the ferroelectric memory of the present invention, the wiring layer is preferably made of titanium or a titanium compound. Such a material is required to have fine processablity, corrosion resistance, low resistivity, etc., and Al is widely used as the material for the wiring layer. However, when Al is in contact with the Si of the diffusion layer, Si and Al make mutual diffusion during the heat treatment, which may destroy the pn junction between the diffusion layer and the semiconductor substrate. Hence, in order to prevent the mutual diffusion between Al and Si, it is preferred to provide a barrier film made of a titanium- or titanium compound-containing material. It is also preferred that the barrier film is a multilayered film comprising, for example, a Ti layer (lowermost), a TiN layer and an Al layer in this order. Such a multilayered film is used because TiN has inferior adhesivity to Si and high contact resistance to Si.

In the ferroelectric memory of the present invention, the ferroelectric film is preferably made of PbZr$_x$Ti$_{1-x}$O$_3$ or SrBi$_2$Ta$_2$O$_9$, because a ferroelectric film made of such a material can give a satisfactory hysteresis curve at ordinary temperature.

In the ferroelectric memory of the present invention, a SiO$_2$ film or the like is used as the protective film. The thickness of the protective film is usually 200 to 500 nm. When the thickness is smaller than 200 nm, short-circuiting may occur between the wiring on the protective film and the lower wiring of the gate electrode or the like. When the thickness is larger than 500 nm, disconnection may occur in the contact holes.

The ferroelectric memory of the present invention has a unit memory cell structure in which a ferroelectric capacitor is connected to a field effect transistor formed on a semiconductor substrate. Alternatively, the unit memory cell structure may be one in which a plurality of field effect transistors and a plurality of ferroelectric capacitors are combined.

EXAMPLE 1

Next, description is made on the example of the present invention with reference to the accompanying drawings.

FIG. 1 is a sectional view showing the first example of the present ferroelectric memory. A ferroelectric capacitor comprising a lower electrode 11 made of Pt, a ferroelectric film 12 made of PZT and an upper electrode 15 made of Pt is formed on an interconnection insulating film formed on a field effect transistor built into a semiconductor substrate. To enable electrical connection between the field effect transistor and the ferroelectric capacitor, contact holes are formed which communicate with one of the diffusion layers of the field effect transistor or with the upper electrode of the ferroelectric capacitor. A conductor 13 made of the same material as used for the upper electrode is formed in the contact hole 6 so as to contact with the upper electrode and extend to the outside of the contact hole. A wiring layer 14 made of a Ti layer (lowermost), a TiN layer, an Al layer and a TiN layer in this order is formed so as to fill the contact hole communicating with one of the diffusion layers of the field effect transistor, and is electrically connected to the conductor 13 at the outside of said contact hole.

Figure 2A:
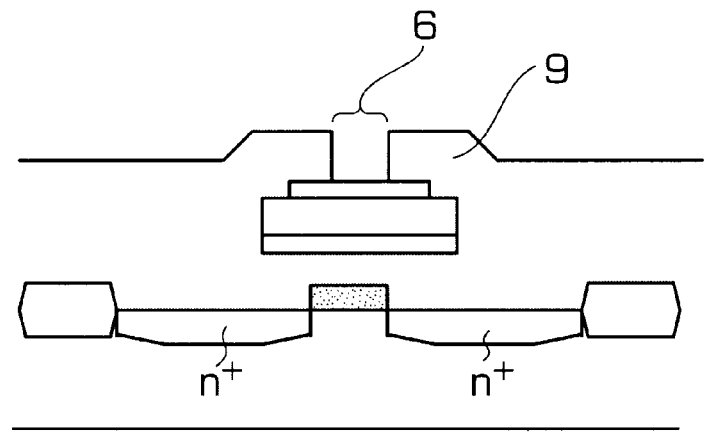
FIG. 2(a)–2(c) are sectional views showing the steps employed in the process for producing a ferroelectric memory of the present invention.
Figure 2B:
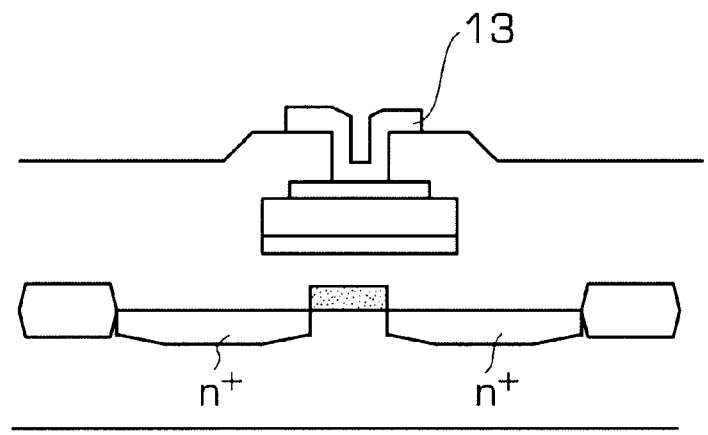
Figure 2C:
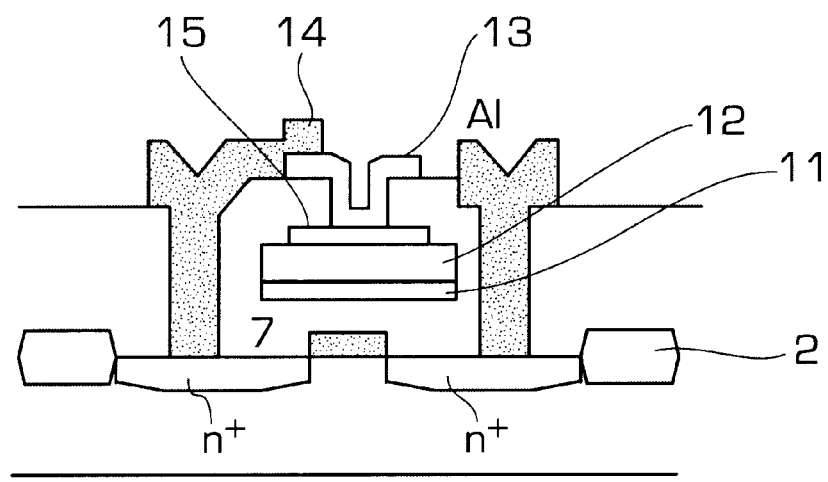
Figure 6A:
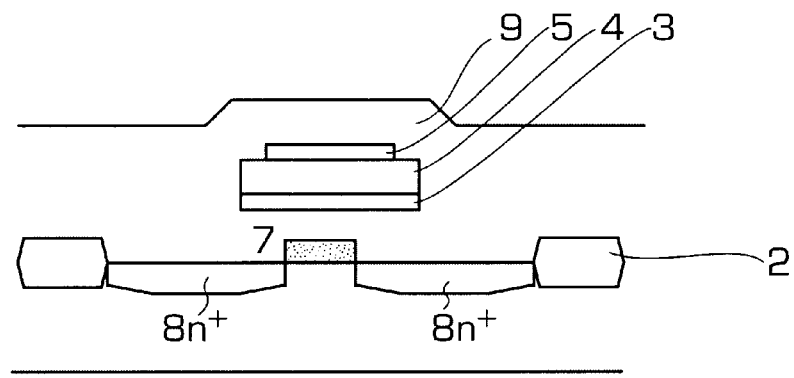
FIG. 6(a)–6(c) are sectional views showing the steps employed in the process for producing a conventional ferroelectric memory.
Figure 6B:
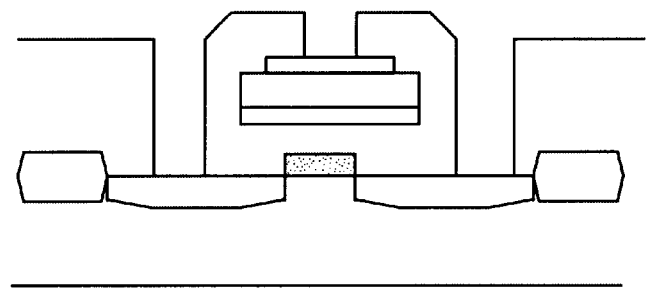
Figure 6C:
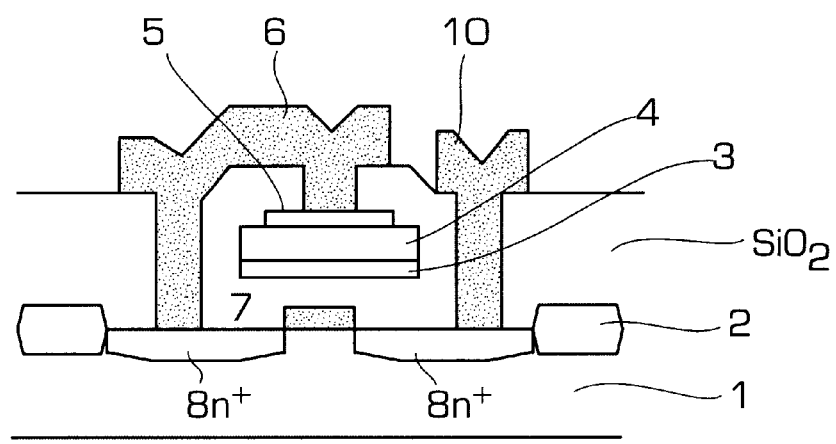

The process for producing the ferroelectric memory of FIG. 1 is explained with reference to FIG. 2. A ferroelectric capacitor comprising a lower electrode, a ferroelectric film and an upper electrode in this order is formed; thereon is formed a protective film 9 made of SiO$_2$; in the protective film is formed a contact hole communicating with the upper electrode of the ferroelectric capacitor [FIG. 2(*a*)]. Then, a conductor 13 made of the same material (Pt) as used for the upper electrode is formed in the contact hole so as to contact with the upper electrode and extend to the outside of the contact hole [FIG. 2(*b*)]. Further, contact holes communicating with the diffusion layers of the field effect transistor are formed. In one of these contact holes is formed a wiring layer 14 made of a Ti layer (lowermost), a TiN layer, an Al layer and a TiN layer in this order, so as to contact with the diffusion layer and form, at the outside of the contact hole, a laminated structure with the conductor 13 [FIG. 2(*c*)].

In the above first example, the conductor 13 is formed on the upper electrode 15. It is possible to combine the upper electrode and the conductor to form a structure in which the upper electrode is extended to the outside of the contact hole as shown in a second example of FIG. 3. In this second example, a ferroelectric film 12 and a protective film are formed in this order; a contact hole is formed in the protective film; then, an upper electrode 13 is formed so as to extend to the outside of the contact hole.

In the ferroelectric memory of the present invention, on the upper electrode of a ferroelectric capacitor is provided a conductor made of substantially the same material as used for the upper electrode. Presence of this conductor can effectively prevent the reduction in residual polarization intensity of ferroelectric capacitor, which may occur during the heat treatment conducted, after the formation of wiring layer, for reducing the variation of threshold value of field effect transistor or during the heat treatment conducted for formation of protective film. Therefore, the ferroelectric memory of the present invention can have high reliability in data-rewriting life and memory retention property.

What is claimed is:

1. A ferroelectric memory comprising:
   a semiconductor substrate,
   a memory cell transistor formed on the semiconductor substrate,
   a ferroelectric capacitor formed on the semiconductor substrate,
   the ferroelectric capacitor comprising a lower electrode, an upper electrode and a ferroelectric film interposed between the upper electrode and the lower electrode, a conductor formed on the upper electrode so as to contact with the upper electrode, and a wiring layer, wherein the conductor is connected to the memory cell transistor by the wiring layer.

2. A ferroelectric memory according to claim 1, wherein the conductor is made mainly of Pt, Ir, Ru, $RuO_2$, Au or TiN.

3. A ferroelectric memory according to claim 1, wherein the upper electrode is made mainly of Pt, Ir, Ru, $RuO_2$ or Au.

4. A ferroelectric memory according to claim 1, wherein the wiring layer comprises titanium or a titanium compound.

5. A ferroelectric memory according to claim 1, wherein the ferroelectric film is made of $PbZr_xTi_{1-x}O_3$ or $SrBi_2Ta_2O_9$.

6. A ferroelectric memory comprising:
   a semiconductor substrate,
   a memory cell transistor formed on the semiconductor substrate,
   a ferroelectric capacitor formed on the semiconductor substrate,
   a protective film formed on the ferroelectric capacitor,
   the ferroelectric capacitor comprising a lower electrode, an upper electrode and a ferroelectric film interposed between the upper electrode and the lower electrode,
   wherein the protective film having therein a contact hole communicating with the upper electrode, the ferroelectric capacitor and the memory cell transistor are electrically connected via the contact hole,
   a wiring layer, and
   a conductor formed in the contact hole so as to contact the upper electrode and extend to the outside of the contact hole, and wherein the conductor is connected to the memory cell transistor by the wiring layer.

7. A ferroelectric memory according to claim 6, wherein the conductor is made mainly of Pt, Ir, Ru, $RuO_2$, Au or TiN.

8. A ferroelectric memory according to claim 6, wherein the upper electrode is made mainly of Pt, Ir, Ru, $RuO_2$ or Au.

9. A ferroelectric memory according to claim 6, wherein the wiring layer comprises titanium or a titanium compound.

10. A ferroelectric memory according to claim 6, wherein the ferroelectric film is made of $PbZr_xTi_{1-x}O_3$ or $SrBi_2Ta_2O_9$.

11. A ferroelectric memory comprising:
    a semiconductor substrate,
    a memory cell transistor formed on the semiconductor substrate,
    a ferroelectric capacitor formed on the semiconductor substrate,
    a protective film formed on the ferroelectric capacitor, and
    a wiring layer,
    the ferroelectric capacitor comprising a lower electrode, an upper electrode, and a ferroelectric film interposed between the upper electrode and the lower electrode,
    the protective film having therein a contact hole communicating with the ferroelectric capacitor, the ferroelectric capacitor and the memory cell transistor are electrically connected via the contact hole,
    wherein the upper electrode is formed so as to extend into the contact hole and further to the outside of the contact hole, and wherein the upper electrode is connected to the memory cell transistor by the wiring layer.

12. A ferroelectric memory according to claim 11, wherein the upper electrode is made mainly of Pt, Ir, Ru, $RuO_2$ or Au.

13. A ferroelectric memory according to claim 11, wherein the wiring layer comprises titanium or a titanium compound.

14. A ferroelectric memory according to claim 11, wherein the ferroelectric film is made of $PbZr_xTi_{1-x}O_3$ or $SrBi_2Ta_2O_9$.

* * * * *